US 6,642,729 B2

(12) United States Patent
Kang et al.

(10) Patent No.: US 6,642,729 B2
(45) Date of Patent: Nov. 4, 2003

(54) PROBE CARD FOR TESTER HEAD

(75) Inventors: Ki-sang Kang, Suwon (KR); Sung-mo Kang, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/029,031

(22) Filed: Dec. 28, 2001

(65) Prior Publication Data

US 2002/0192986 A1 Dec. 19, 2002

(30) Foreign Application Priority Data

Jun. 16, 2001 (KR) .......................... 2001-34140

(51) Int. Cl.⁷ ............................................. G01R 31/02
(52) U.S. Cl. ....................................... 324/754; 439/912
(58) Field of Search ........................ 439/912, 70, 68; 324/754, 761, 762

(56) References Cited

U.S. PATENT DOCUMENTS 6,118,286 A * 9/2000 Fredrickson ................ 324/754

FOREIGN PATENT DOCUMENTS

| JP | 63-169038 | 7/1988 |
| JP | 12-20850 | 7/2000 |

* cited by examiner

*Primary Examiner*—Gary Paumen
(74) *Attorney, Agent, or Firm*—Lee & Sterba, P.C.

(57) ABSTRACT

A semiconductor integrated circuit wafer tester includes a supporting plate on which a semiconductor wafer may be positioned and a tester head having a circular top plate installed a predetermined distance away from the supporting plate, wherein a probe card in the tester head that includes a circular printed circuit board having a diameter of at least 400 mm (15.75 inches) that is connected to the top plate and having a plurality of probe units formed on the printed circuit board allows electrical parameters of multiple chips formed on the semiconductor wafer to be measured simultaneously.

18 Claims, 8 Drawing Sheets

PROBE CARD FOR TESTER HEAD

BACKGROUND OF THE INVENTION

1. Field of the Invention

The present invention relates to a probe card installed in a tester of an apparatus for testing electrical parameters of chips formed on a semiconductor wafer.

2. Description of the Related Art

Before cutting semiconductor wafers containing manufactured logic or memory chips, the electrical parameters of the semiconductor chips are typically tested using a testing apparatus. A conventional testing apparatus typically includes a supporter on which the semiconductor wafer is positioned and a printed circuit board, which is installed between the supporter and a probe station of the tester for use as a probe card. A probe unit, which includes a plurality of probe pins and is used to test the electrical parameters of the chips on the semiconductor wafer, is installed on the printed circuit board such that the plurality of probes are in one-to-one contact with a plurality of terminal pads formed on each of the chips. The probe unit is arranged such that a plurality of chips may be tested simultaneously on a conventional 200 mm (7.9 inches) wafer. In conventional probe cards, probe units are arranged to be capable of satisfactorily testing ten or more chips simultaneously.

However, when the diameter of a semiconductor wafer is increased to over 300 mm (11.8 inches), the conventional probe card may have difficulty in testing such a semiconductor wafer due to the difference in size between the probe card and the semiconductor wafer. In addition, as the diameter of a semiconductor wafer increases, the number of chips that may be formed on the semiconductor wafer may increase two or more times. Accordingly, it becomes more difficult to effectively test such large-sized semiconductor wafers with the use of a testing apparatus having a conventional probe card because of limited processing speed and throughput.

SUMMARY OF THE INVENTION

To solve the above-described problems, it is a feature of an embodiment of the present invention to provide a probe card for a testing apparatus head, which is capable of testing the electrical parameters of a larger semiconductor wafer by increasing the size of a printed circuit board.

It is another feature of an embodiment of the present invention to provide a probe card for a testing apparatus head that has improved processing speed by increasing the number of probe units.

A testing apparatus according to the present invention includes 1) a supporting plate on which a semiconductor wafer may be positioned; 2) a tester head having a top plate installed a predetermined distance away from the supporting plate; and 3) a probe card interposed between the supporting plate and the top plate and connected to the top plate. The probe card comprises a multi-layered printed circuit board to which are attached a plurality of test probes, each test probe having a plurality of flexible contacts for temporarily connecting with a plurality of contact pads formed on a chip on the semiconductor wafer. The probe card and the top plate are circular and both preferably have a diameter that is at least 400 mm (15.75 inches). More preferably, the diameter of the printed circuit board is 440 mm (17.32 inches).

The plurality of test probes include a plurality of connecting elements, each element having a plurality of contact pins that are preferably formed on the printed circuit board in order to test the electrical characteristics of the chips formed on the semiconductor wafer. The printed circuit board which preferably is divided into four quadrants with the plurality of connecting elements arranged along the circumference of the printed circuit board such that generally one fourth of the plurality of connecting elements are allotted to each of the four quadrants.

The plurality of connecting elements are preferably elongated or bar-shaped. In order to install additional connecting elements on the printed circuit board, the plurality of connecting elements are preferably arranged radially along the circumference of the printed circuit board. In order to increase the number of pins allotted to a unit length of each of the plurality of connecting elements, 112 contact pins are preferably formed at each one of the plurality of connecting elements such that the contact pins are arranged in two rows with 56 contact pins being allotted to each row. Twenty-four such connecting elements are preferably arranged on each of the four quadrants of the printed circuit board.

The center of each of the plurality of connecting elements is an exemplary 191.5 mm (7.54 inches) away from the central point of the printed circuit board. Two adjacent connecting elements belonging to the same quadrant of the printed circuit board among the plurality of connecting elements form an exemplary angle of 3.5 degrees with each other. A connecting element adjacent to one of four boundaries between adjacent quadrants of the printed circuit board forms an exemplary angle of 4.75 degrees with the boundary. A stiffener fixing hole is preferably formed on any one of four boundaries between adjacent quadrants of the printed circuit board and its opposing boundary. The stiffener fixing hole may be a representative 182.5 mm (7.19 inches) away from the central point of the printed circuit board.

Card holder holes are preferably formed on one of four boundaries between adjacent quadrants of the printed circuit board. Two pairs of card holder holes may be formed at opposing boundaries between adjacent quadrants of the printed circuit board, wherein opposing boundaries are two boundaries separated by 180 degrees. One of the card holder holes may preferably be 197.5 mm (7.78 inches) away from the central point of the printed circuit board and another of the card holder holes may preferably be 214.5 mm (8.44 inches) away from the central point of the printed circuit board.

A guide pin hole is preferably formed on each of four boundaries between adjacent quadrants of the printed circuit board. The guide pin hole may preferably be 207.5 mm (8.17 inches) away from the central point of the printed circuit board.

Preferably, each of the connecting elements comprises a male zero-insertion-force (ZIF) type connector, and a ZIF type female connector is formed at the top plate so as to be coupled with the male ZIF type connector.

The printed circuit board for a tester head is enlarged such that a semiconductor wafer having a diameter at least 300 mm (11.8 inches) may be mounted on the printed circuit board. Thus, it is possible to set standards in measuring the electrical characteristics of a next-generation semiconductor device, and increase the number of chips being processed simultaneously in accordance of the increase of the size of a semiconductor wafer.

These and other features of the present invention will be readily apparent to those of ordinary skill in the art upon review of the detailed description that follows.

BRIEF DESCRIPTION OF THE DRAWINGS

The above features and advantages of the present invention will become more apparent by describing in detail preferred embodiments thereof with reference to the attached drawings in which like reference characters represent like elements and in which.

DETAILED DESCRIPTION OF THE INVENTION

Korean Patent Application No. 2001-34140, filed on Jun. 16, 2001, entitled: "Probe Card for Tester Head," is incorporated by reference herein in its entirety.

The present invention will now be described more fully with reference to the accompanying drawings, in which a preferred embodiment of the invention is shown. This invention may, however, be embodied in many different forms and should not be construed as being limited to the particular embodiment set forth herein. Rather, this embodiment is provided so that this disclosure will be thorough and complete, and will fully convey the concept of the invention to those skilled in the art.

Figure 1:
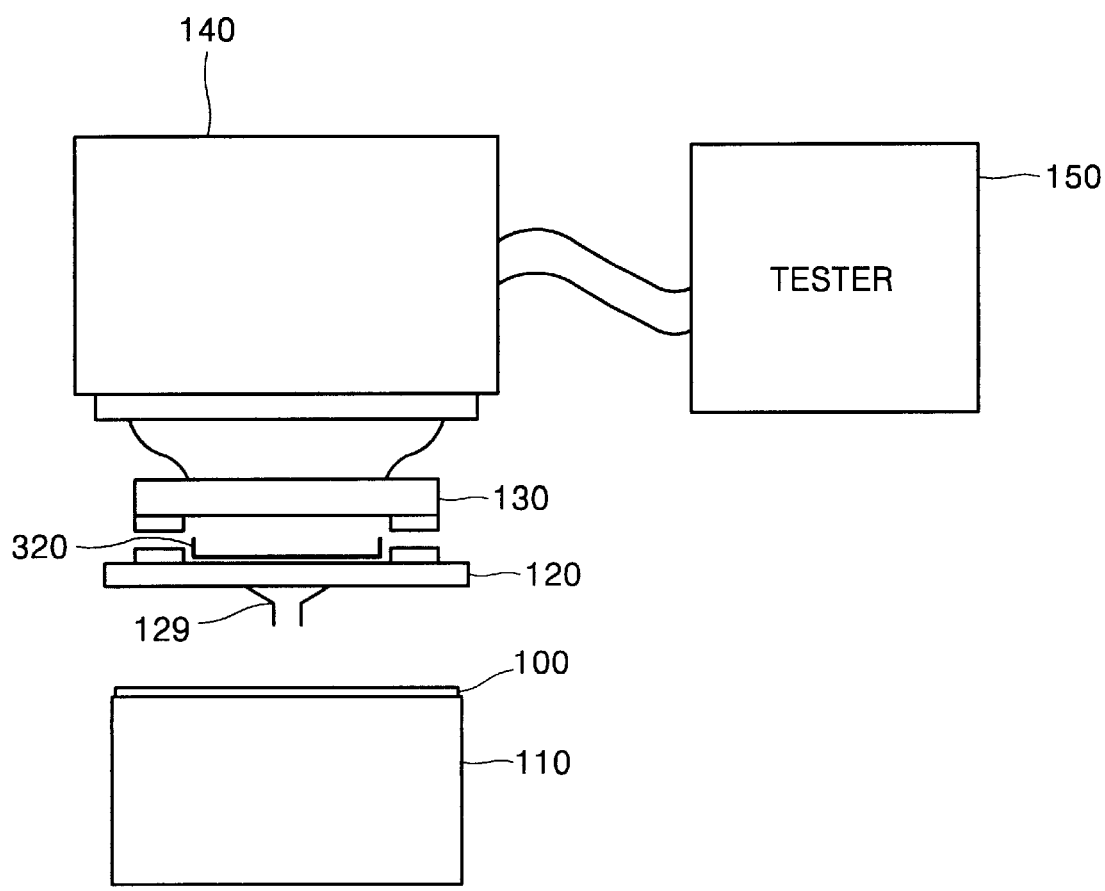
FIG. 1 illustrates a schematic view of a testing apparatus which includes a tester head according to the present invention.

FIG. 1 illustrates a schematic view of a testing apparatus, which includes a printed circuit board for a tester head according to the present invention. The testing apparatus, as shown in FIG. 1, includes a wafer supporter 110, on which a semiconductor wafer 100 having a plurality of chips is positioned, and a tester head 140 installed a predetermined distance above the wafer supporter 110. A printed circuit board 120 is interposed between the semiconductor wafer 100 and the tester head 140 and includes a probe unit 129. Probe unit 129 is comprised of a plurality of probes that electrically contact the chips formed on the semiconductor wafer 100. A top plate 130 is installed under the tester head 140 to enable the separation of the tester head 140 from the printed circuit board 120. A tester 150 controls the testing of the electrical parameters of each of the chips on the semiconductor wafer 100 through the printed circuit board 120. The wafer supporter 110 and the tester head 140 are installed so as to be capable of moving toward and apart from each other. Typically, the tester head 140 is fixed, and the wafer supporter 110 is movable in order to bring the probe unit 129 into contact with the semiconductor wafer 100 for testing. Alternatively, the wafer supporter 110 may be fixed with the tester head 140 being movable.

FIG. 1 additionally illustrates a stiffener 320, which is described in greater detail in connection with FIG. 7 below.

Figure 2A:
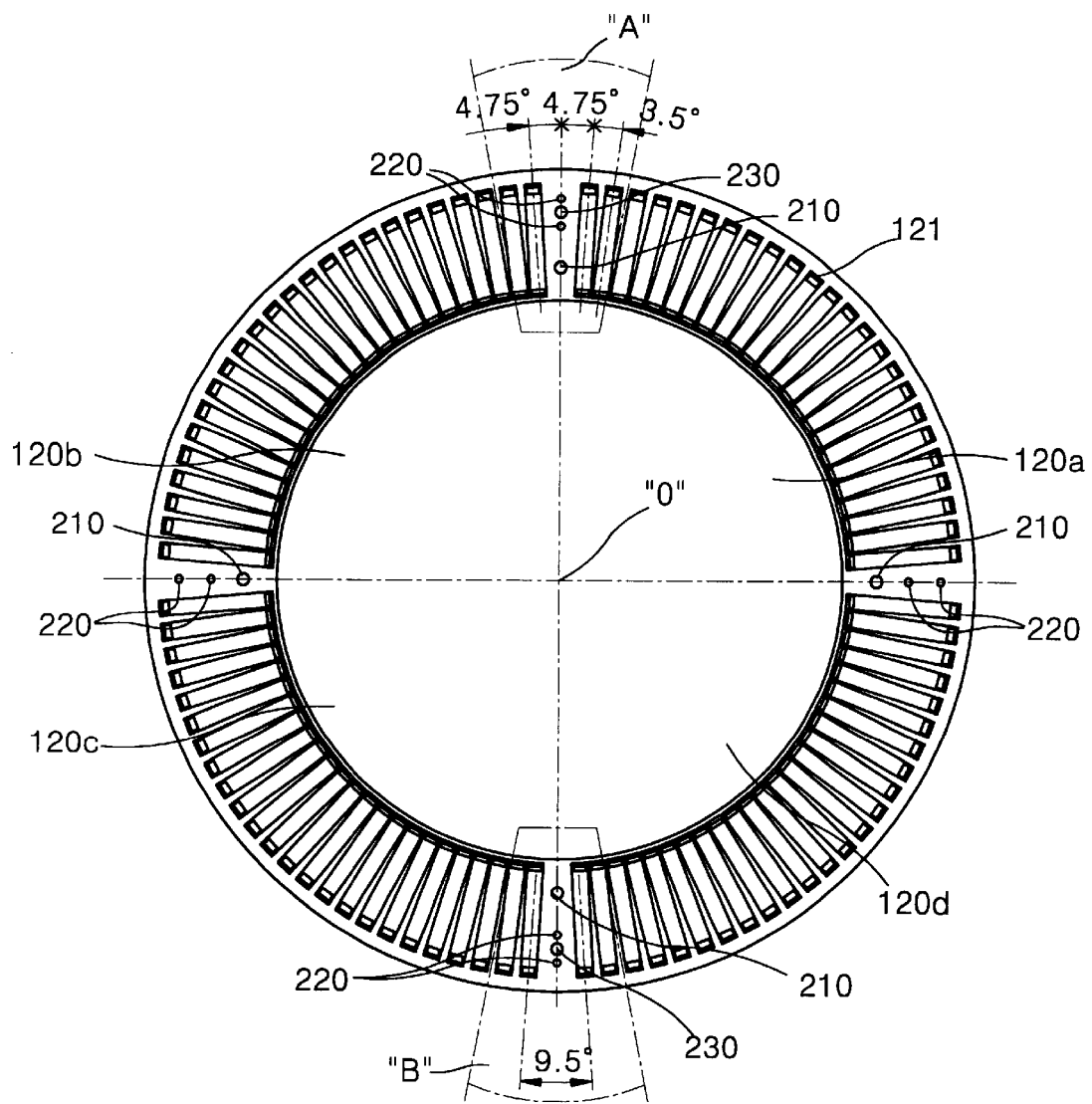
FIGS. 2A and 2B illustrate top, plan views of a probe card of a tester head according to the present invention.
Figure 2B:
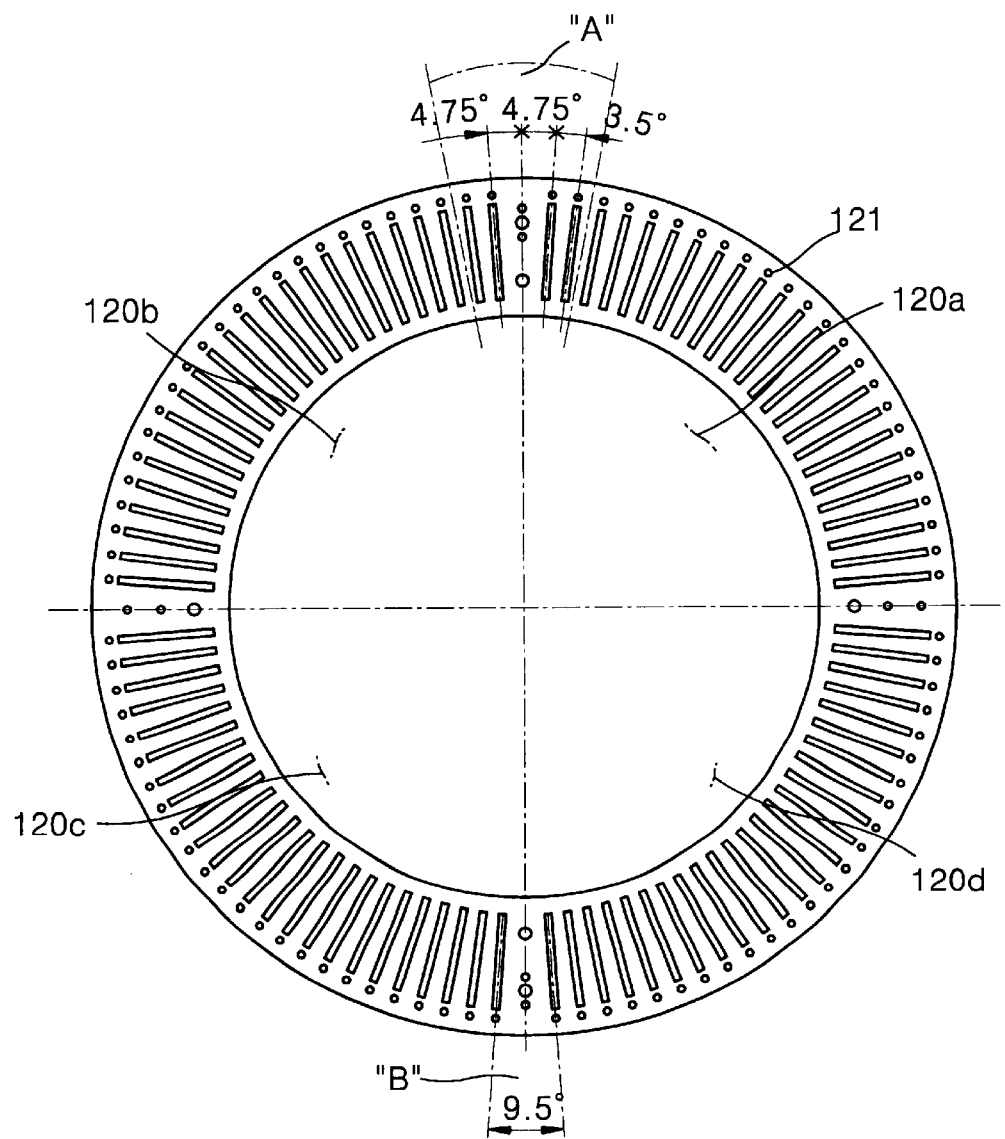

FIGS. 2A and 2B illustrate top cross-section views of a probe card 120 of a tester head according to the present invention. The top surface is removed for the purpose of illustrating the arrangement of a plurality of connecting elements installed on the probe card 120 shown in FIG. 1.

Referring to FIG. 2A, the printed circuit board 120 is preferably a circular plate, having a plurality of connecting elements 121. The printed circuit board 120 is divided into four quadrants 120a, 120b, 120c, and 120d, and the connecting elements 121 are preferably arranged along the circumference of the printed circuit board 120 at a predetermined distance away from a central point O. Two connecting elements 121 placed nearest to any of the boundaries between adjacent quadrants among the four quadrants 120a, 120b, 120c, and 120d are arranged a predetermined distance apart such that they form a predetermined radial angle relative to each other and point O. The connecting elements 121 are preferably elongated or bar-shaped. A plurality of contact pins (not shown) are installed at each of the connecting elements 121 so as to be in contact with the probes of the probe unit 129 of FIG. 1. There are an exemplary 96 connecting elements 121 arranged on the printed circuit board 120, with 24 connecting elements being allotted to each quadrant 120a, 120b, 120c, and 120d.

Figure 3:
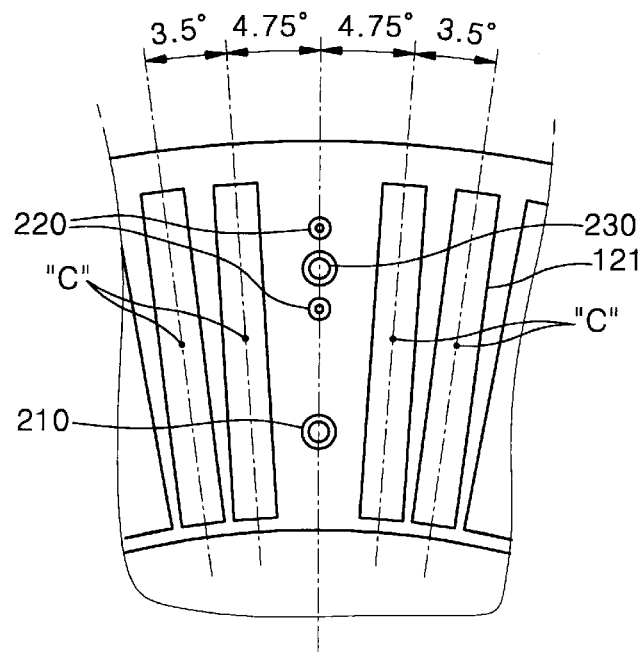
FIG. 3 illustrates an exploded view of the portion 'A' of FIGS. 2A and 2B.

FIG. 3 illustrates an exploded view of the portion "A" of a probe card 120 of FIGS. 2A and 2B. Referring to FIGS. 2A, 2B and 3, the connecting elements 121 are preferably arranged such that two adjacent elements belonging to the same quadrant form an angle of 3.5 degrees with each other. Thus, even when rotating the printed circuit board 120 about its central point O, it is possible to find how many connecting elements have already passed 121 by calculating the angle by which the printed circuit board 120 rotates and thus select a particular connecting element 121 from among the plurality of connecting elements 121. Since two adjacent connecting elements 121 at a quadrant boundary preferably form a larger angle, such as an exemplary angle of 9.5 degrees, with each other, it is possible to visibly identify the four quadrant boundaries on the printed circuit board 120 quite easily. The larger spaces at the quadrant boundaries allow for the forming of a plurality of functional holes 210, 220, and 230 as shown in FIGS. 2A and 4, which may be used to couple the printed circuit board 120 with the top plate 130 of the tester head 140 securely and easily, as shown in FIG. 1.

In addition, a center of each of the plurality of connecting elements "C" may be an exemplary 191.5 mm (7.54 inches) away from the central point of the printed circuit board.

Figure 4:
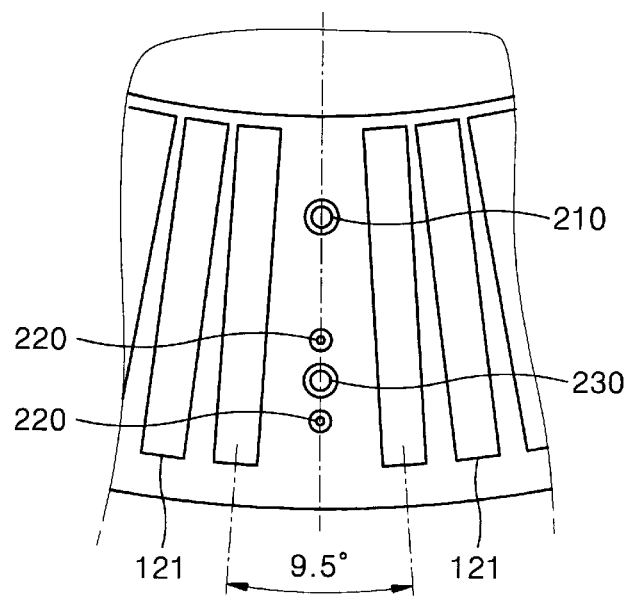
FIG. 4 illustrates an exploded view of the portion 'B' of FIGS. 2A and 2B.

FIG. 4 illustrates an exploded view of the portion "B" between the third and fourth quadrants 120c and 120d of FIGS. 2A and 2B. Referring to FIGS. 2A, 2B and 4, the functional holes 210, 220, and 230 are preferably formed on the radial boundary between the third and fourth quadrants 120c and 120d which leads to the central point O of the printed circuit board 120 and its opposing boundary. The functional holes 210, 220, and 230, as shown in FIG. 2A, are preferably stiffener fixing holes 210, card holder holes 220, and guide pin holes 230, respectively.

The stiffener fixing holes 210 are holes into which protrusions (not shown) of a stiffener (not shown) may be placed between the top plate 130 of FIG. 1 and the printed circuit board 120 to prevent the printed circuit board 120 from warping. Each of the stiffener fixing holes 210 is preferably formed 182.5 mm (7.19 inches) away from the central point O of the printed circuit board 120 and predetermined portions around the entrance aperture of each of the stiffener fixing holes 210 are preferably formed to have an inversed cone shape by a chamfering rounding process. An exemplary diameter of each of the stiffener fixing holes 210 is about 6 mm (0.24 inches).

The card holder holes 220 are holes into which fixing pins (not shown) formed to protrude from a card holder (not shown) may be used to align and/or mount the printed circuit board 120 to the card holder (not shown). Since the printed circuit board 120 may be heavy, two card holder holes 220 are preferably formed at each of the quadrant boundaries to allow the printed circuit board 120 to be fixed to the card holder with eight card holder holes 220. The two card holder holes 220 may be located an exemplary 197.5 mm (7.78 inches) and 214.5 mm (8.44 inches) away from the central point O of the printed circuit board 120.

The guide pin holes 230 are holes into which guide pins (not shown) formed to protrude from the card holder (not shown) to prevent the printed circuit board 120, which is preferably symmetrical about the central point O, from being wrongly fit into the card holder (not shown). The guide pin holes 230 are preferably formed at only two boundaries between the first and second quadrants 120a and 120b and between the third and fourth quadrants 120c and 120d, which divide the printed circuit board 120 into right and left semicircles. Each of the guide pin holes 230 is preferably positioned between two card holder holes 220 at 207.5 mm (8.17 inches) away from the central point O.

Figure 5A:
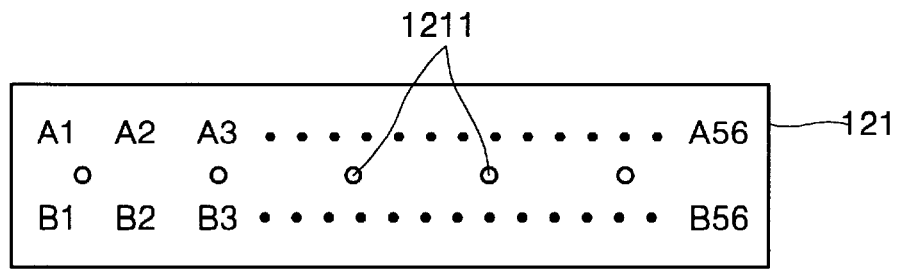
FIGS. 5A through 5D illustrate diagrams showing a connector installed at a connecting element of a probe card for a tester head according to the present invention.
Figure 5B:
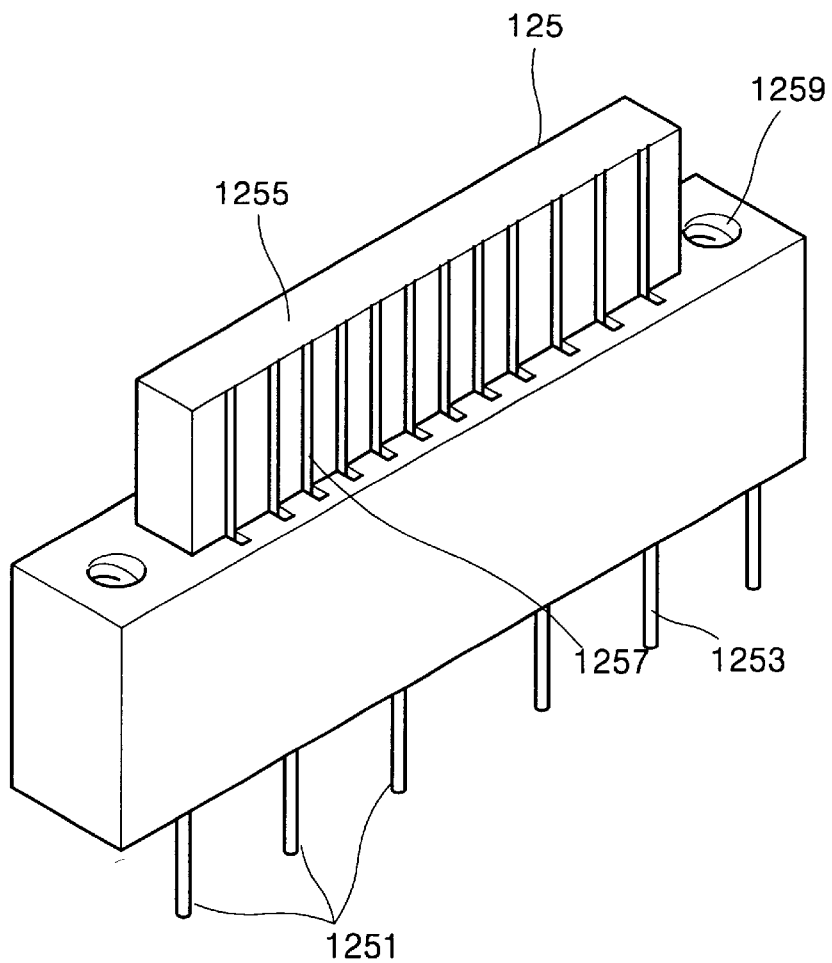

FIG. 5A illustrates a top view of one of the connecting elements 121 arranged on the printed circuit board 120, and FIG. 5B illustrates a perspective view of a male connector 125 for coupling the connecting elements 121 to the top plate 130.

Referring to FIG. 5A, the connecting element 121 is preferably rectangular, having a plurality of fixing holes 1211 formed to a predetermined depth along the central line of the connecting element 121 so that fixing pins 1251 and 1253 of the male connector 125 shown in FIG. 5B are fit into the fixing holes 1211 and thus the male connector 125 is fixed to the connecting element 121. A plurality of contact pins (not shown), which will electrically contact each of the probes formed in the probe unit 129, are preferably arranged in two rows along the longitudinal direction of the connecting element 121. The contact pins will be electrically connected to first connecting contact terminals 1257 of the male connector 125. The number of the contact pins (not shown) may be varied depending on the number of parameters to be tested, however, in the present embodiment, 112 contact pins are formed such that the contact pins are arranged in two rows of 56 contact pins each (A1-A56 and B1-B56). A number is assigned to each of the contact pins, and the contact pins are connected to different terminals according to the test items of the tester 150. For example, the contact pins may be sequentially numbered from a contact pin nearest to the central point O of the printed circuit board 120 to a contact pin furthest from the central point O, and such arrangement of the numbered contact pins may be stored as the addresses of the contact pins in a central processing unit (not shown) of the tester. Thus, the central processing unit can control the connection configuration of the internal terminals to be tested.

A numeric label may be assigned to each of the connecting elements 121 having such a structure according to their positions or functions. For example, the connecting elements 121 may be sequentially numbered clockwise or counterclockwise with respect to a predetermined axis, i.e. horizontal axis as shown in FIG. 5a. The arrangement of the numbered connecting elements 121 is preferably stored as the addresses of the numbered connecting elements 121 in the central processing unit of the tester 150, which may be programmed so as to automatically control the printed circuit board 120 and the connection of the connecting elements 121.

Figure 5C:
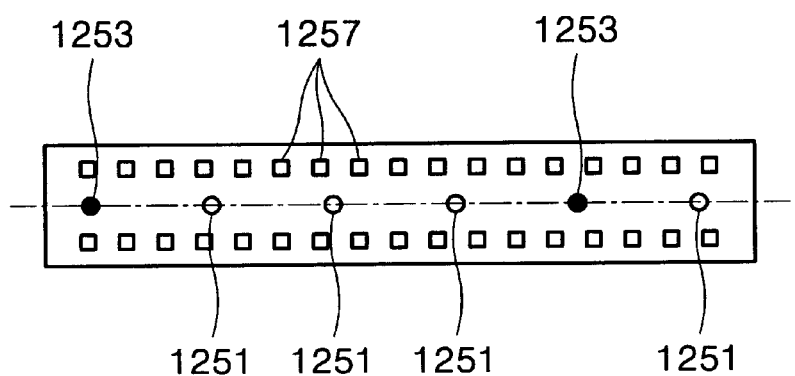
Figure 5D:
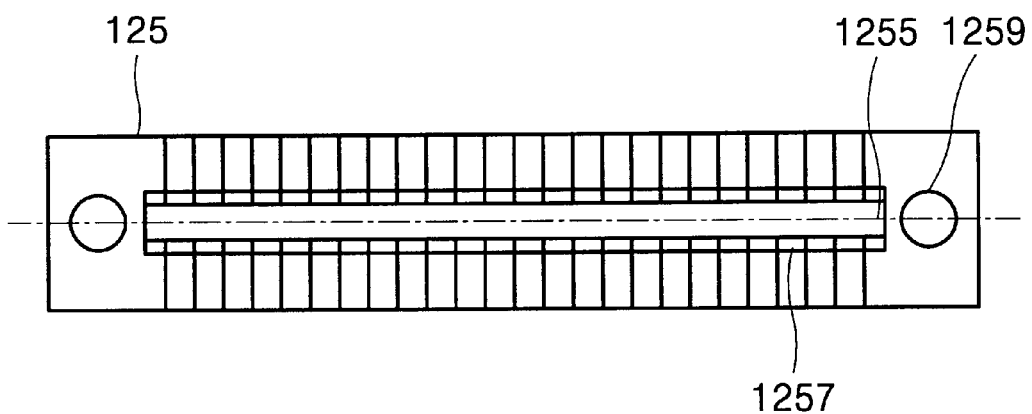

FIGS. 5B, 5C and 5D illustrate a perspective view, a top view, and a bottom view, respectively, of the male connector 125, which may be attached to the top surface of the connecting element 121 of FIG. 5A and coupled with the top plate 130 of the tester head 140. As shown in FIGS. 5B through 5D, a predetermined area of the male connector 125 to directly contact the connecting element 121 is preferably rectangular. As shown in FIG. 5C, the predetermined area of the male connector 125, i.e., the lower part of the male connector 125 to be in direct contact with the connecting element 121 is a planar surface. A plurality of connector fixing pins 1251 and at least one base fixing pin 1253 are preferably formed to protrude from the bottom surface along the length of the male connector 125 and to fit into the fixing holes 1211 such that the male connector 125 is aligned with the connecting element 121 and is fixed to the printed circuit board 120.

Referring to FIGS. 5B and 5D, a male coupling portion 1255 is preferably formed to a predetermined height on the upper part of the male connector 125 to be coupled with the top plate 130 of FIG. 1. A plurality of first connecting contact terminals 1257 are preferably formed on two opposing walls of the male coupling portion 1255 along the length of the male connector 125. Each of the first connecting contact terminals 1257 is preferably formed of a conductive metal plate in a bar shape. Preferably, the plurality of first connecting contact terminals 1257 are formed to have elasticity width-wise. As shown in FIG. 5D, each one of the first connecting contact terminals 1257 are preferably formed through the main body of the male connector 125 so that they reach the bottom surface of the main body of the male connector 125 on which the base fixing pin 1253 is formed. The first connecting contact terminals 1257 will be in contact with the contact pins (not shown), which are actually located at the positions marked by reference numerals A1 through A56 and B1 through B56 in FIG. 5A on each of the connecting elements 121 such that the signals of the connector fixing pins 1251 protruding over the bottom surface of the main body of the male connector 125 may be transmitted to the top plate 130. As a result, electrical signals obtained from measuring pad terminals, which are connected to a chip on the semiconductor wafer 100 sequentially pass through the connecting elements 121 of the printed circuit board 120, the male connector 125, and the top plate 130 and are measured by the tester 150, where the electrical parameters of the chip on the semiconductor wafer 100 may be analyzed.

Figure 6A:
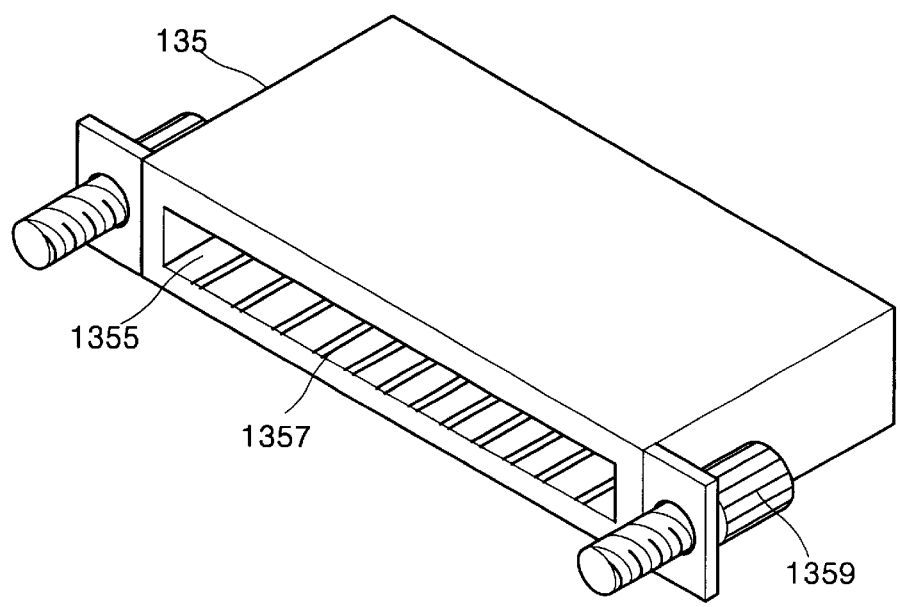
FIGS. 6A and 6B illustrate diagrams showing a connector installed on a top plate, which will be coupled with a connector installed at a connecting element of a probe card for a tester head according to the present invention.
Figure 6B:
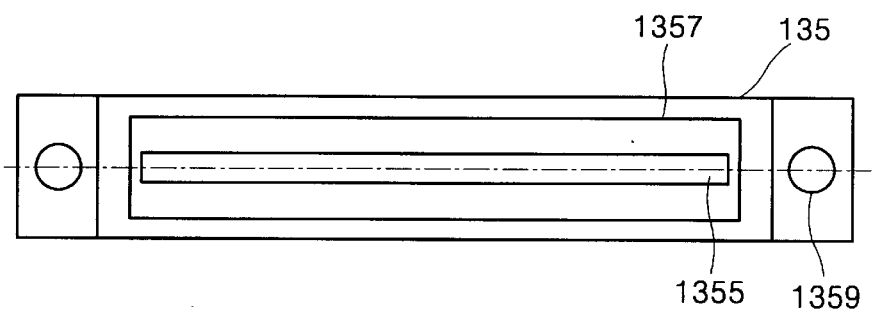

FIGS. 6A and 6B illustrate a perspective view and a bottom view, respectively, of a female connector 135 to be attached to the top plate 130 of FIG. 1 and coupled with the male connector 125 of the printed circuit board 120.

Referring to FIG. 6A, one side of the female connector 135 is attached to the top plate 130 of FIG. 1 and the other side of the female connector 135 has a female coupling portion 1355, which has a predetermined recess that is prepared for being coupled with the male coupling portion 1255 of the printed circuit board 120 by inserting the male coupling portion 1255 into the female coupling portion 1355. The cross section of the female coupling portion 1355 has a rectangular shape such that the rectangular male coupling portion 1255 may be fit in a mating arrangement into the female coupling portion 1355. A plurality of second connecting contact terminals 1357 are formed on the two opposing inner walls of the female connector 135 along the length of the female connector 135 such that the plurality of second connecting contact terminals 1357 may correspond one-to-one with the plurality of first connecting contact terminals 1257 formed along the length of the two opposing outer walls of the male coupling portion 1255. This allows for direct electrical connection between associated terminals 1357 and 1257 when inserting the male connector 125 into the female connector 135.

Each one of the plurality of second connecting contact terminals 1357 is preferably formed of a conductive metal in a bar shape in order to receive the electrical signals from a chip on the semiconductor wafer 100 via the male connecting contact terminals 1257 and to transmit the electrical signals to the tester 150. When the male and female connectors 125 and 135 are coupled with each other, predetermined surface and tensile properties of the contact terminals 1257 and 1357 prevent high contact resistance and resulting poor electrical contact between the male and female connectors 125 and 135. As a result, it is possible to reduce measurement errors that may occur during the transfer of electrical signals from the chips on the semiconductor wafer 100 to the top plate 130 of FIG. 1.

Unlike conventional embodiments, the female connector 135 may be mounted on the printed circuit board 120, and the male connector 125 may be attached to the top plate 130. However, it is preferable that male connector 125 is connected to each of the connecting elements 121 and associated female connector 135 is located at the top plate 130 due to the relative ease and lower cost of manufacturing. Connectors having such a structure are known in the art as zero insertion force (ZIF) connectors. Alternatively, POGO pin type connectors are generally used for conventional printed circuit boards.

As shown in FIGS. 5B, 5D, 6A and 6B, in order to strongly couple the male and female connectors 125 and 135 with each other, auxiliary coupling means 1259 (of FIGS. 5B and 5D) and 1359 (of FIGS. 6A and 6B) may be further formed on connectors 125 and 135, respectively. In other words, holes may be prepared on the sides of the male connector 125 and the female connector 135, and then a screw bolt and a screw nut, a one-touch type coupling jack, or the like may be installed in the holes to attach connectors 125 and 135 together more securely. The structure and shape of the auxiliary coupling means 1259 and 1359, which are capable of being attached to or isolated from the male and female connectors 125 and 135, respectively, may be varied according to usage and purposes.

Since the probe card for a tester head according to the present invention is preferably formed to have a diameter of at least 400 mm (15.75 inches), and more preferable, a diameter of 440 mm (17.32 inches), semiconductor wafers having a diameter larger than the conventional 200 mm (7.8 inches) may be tested, for example, 300 mm (11.8 inches) diameter wafers may be tested.

Figure 7:
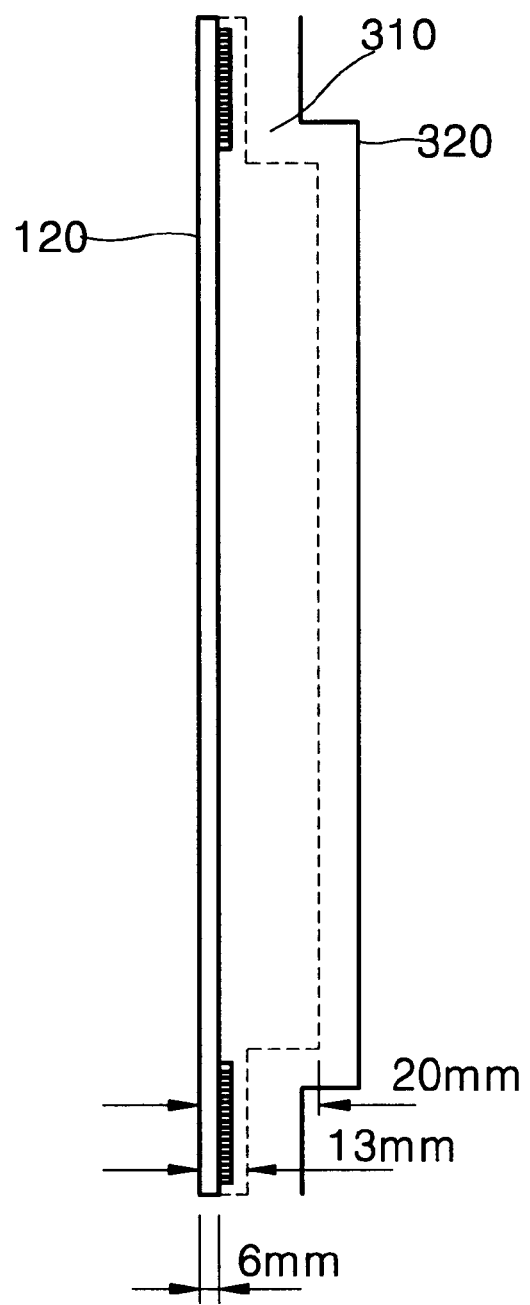
FIG. 7 illustrates a side view of a probe card for a tester head according to the present invention.

FIG. 7 illustrates a side view of a probe card for a tester head according to another embodiment of the present invention. The printed circuit board 120 is preferably constructed by stacking a plurality of printed circuit boards, each one having unique metal wiring circuits. For example, the printed circuit board 120 may be formed to a thickness of about 6 mm (0.24 inches) by laying ten printed circuit boards one on top of another. The central portion of the printed circuit board 120 protrudes toward the top plate 130 of FIG. 1 so that a stiffener 320 may be easily mounted on the printed circuit board 120. In other words, a projection 310 for supporting the stiffener 320, which is a flange type, may be formed inside the printed circuit board 120.

In addition, the probe unit 129 of FIG. 1 including a plurality of probes may be formed at the central region of the printed circuit board 120 such that the probe unit would be in contact with a plurality of terminal pads formed on a chip on the semiconductor wafer 100 of FIG. 1 in order to test the electrical parameters of the chip on the semiconductor wafer 100. With one probe unit being able to test a single chip, a plurality of chips may be tested simultaneously through the use of multiple probe units. Since the surface area of the probe card for a tester head according to the present invention is preferably large, it is possible to mount multiple probe units on the probe card, thereby increasing the testing throughput of a testing apparatus.

As described above, the probe card for a tester head according to the present invention has the following advantages. First, since the diameter of a printed circuit board, which is used as the probe card for a tester card, is formed to be larger than 400 mm (15.75 inches), it is possible to improve the processing ability of a testing apparatus adopting such a large printed circuit board such that the testing apparatus may process multiple chips simultaneously and test the electrical parameters of chips formed on a semiconductor wafer of a larger than conventional size.

Second, since the probe card for a tester head according to the present invention is connected to a top plate by a ZIF type connector, it is possible to reduce contact resistance and thus prevent an error in measurement, which error may be caused by a high contact resistance, and also to improve the measurement reliability of a testing apparatus by adopting the probe card for a tester head according to the present invention.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A probe card for a tester head in a testing apparatus including a supporting plate on which a semiconductor wafer may be positioned and the tester head installed a predetermined distance away from the supporting plate and having a top plate, and which tests the electrical parameters of one or more chips formed on the semiconductor wafer, the probe card comprising:
   a printed circuit board connected to the top plate, wherein the printed circuit board is a circular plate having a central point at the center thereof, a diameter of no less than 400 mm (15.75 inches), and is partitioned into four quadrants;
   a plurality of connecting elements each having a plurality of contact pins formed on the printed circuit board such that generally one fourth of the plurality of connecting elements are allotted to each one of the four quadrants, and such that the center of each of the plurality of connecting elements is 191.5 mm (7.54 inches) away from the central point of the printed circuit board, wherein two adjacent connecting elements belonging to the same quadrant of the printed circuit board among the plurality of connecting elements form an angle of 3.5 degrees with each other; and
   a probe unit connected to the printed circuit board.

2. A probe card as claimed in claim 1, wherein the printed circuit board is formed by laying a plurality of printed circuit boards one on top of another.

3. A probe card as claimed in claim 1, wherein the diameter of the printed circuit board is approximately 440 mm (17.32 inches).

4. A probe card as claimed in claim 1, wherein a stiffener fixing hole is formed on any one of four boundaries between adjacent quadrants of the printed circuit board and its opposing boundary.

5. A probe card as claimed in claim 4, wherein the stiffener fixing hole is 182.5 mm (7.19 inches) away from the central point of the printed circuit board.

6. A probe card as claimed in claim 1, wherein card holder holes are formed on one of four boundaries between adjacent quadrants of the printed circuit board and its opposing boundary.

7. A probe card as claimed in claim 6, wherein two pairs of card holder holes are formed one each at opposing boundaries between adjacent quadrants of the printed circuit board.

8. A probe card as claimed in claim 7, wherein the closer of the card holder holes is 197.5 mm (7.78 inches) away from the central point of the printed circuit board and the further of the card holder holes is 214.5 mm (8.44 inches) away from the central point of the printed circuit board.

9. A probe card as claimed in claim 1, wherein a guide pin hole is formed on each of the four boundaries between adjacent quadrants of the printed circuit board.

10. A probe card as claimed in claim 9, wherein the guide pin hole is 207.5 mm (8.17 inches) away from the central point of the printed circuit board.

11. A probe card as claimed in claim 1, wherein a connecting element adjacent to one of four boundaries between adjacent quadrants of the printed circuit board forms an angle of 4.75 degrees with the boundary.

12. A probe card as claimed in claim 1, wherein 24 connecting elements are arranged on each of the four quadrants of the printed circuit board.

13. A probe card as claimed in claim 1, wherein the plurality of connecting elements are arranged along the circumference of the printed circuit board and are a predetermined distance away from the central point of the printed circuit board.

14. A probe card as claimed in claim 13, wherein the plurality of connecting elements are bar-shaped and are arranged along the circumference of the printed circuit board in a radial manner such that they are symmetric with respect to the central point of the printed circuit board.

15. A probe card as claimed in claim 1, further comprising 112 contact pins per connecting element.

16. A probe card as claimed in claim 15, wherein the contact pins are arranged on each of the connecting elements in two rows and 56 contact pins are allotted to each row.

17. A probe card as claimed in claim 1, wherein each of the connecting elements comprises a zero insertion force (ZIF) type connector unit.

18. A probe card as claimed in claim 17, wherein the ZIF type connector unit comprises a ZIF type male connector and a ZIF type female connector, and wherein the ZIF type female connector is formed at the top plate and coupled with the male connector of the ZIF type connector.

* * * * *